(12) United States Patent
Jin et al.

(10) Patent No.: US 12,341,431 B2
(45) Date of Patent: Jun. 24, 2025

(54) POWER MODULE WITH ALTERNATELY ARRANGED SWITCHING UNITS

(71) Applicant: Delta Electronics, Inc., Taoyuan (TW)

(72) Inventors: Da Jin, Taoyuan (TW); Dongjie Gu, Taoyuan (TW); Mingyun Yang, Taoyuan (TW); Xueliang Chang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 819 days.

(21) Appl. No.: 17/461,552

(22) Filed: Aug. 30, 2021

(65) Prior Publication Data

US 2022/0131469 A1    Apr. 28, 2022

(30) Foreign Application Priority Data

Oct. 27, 2020   (CN) .......................... 202011164463.3
Dec. 11, 2020   (CN) .......................... 202011463191.7

(51) Int. Cl.
*H02M 3/335*   (2006.01)
*H02M 1/00*    (2006.01)
(Continued)

(52) U.S. Cl.
CPC ......... *H02M 3/335* (2013.01); *H02M 1/0048* (2021.05); *H02M 7/5395* (2013.01); *H05K 1/162* (2013.01); *H05K 1/165* (2013.01)

(58) Field of Classification Search
CPC ...... H02M 1/0048; H02M 1/00; H02M 3/003; H02M 3/335; H02M 3/33578;
(Continued)

(56) References Cited

U.S. PATENT DOCUMENTS 10,185,141 B2   1/2019   Wang et al.
10,701,795 B2   6/2020   Pando et al.
(Continued)

FOREIGN PATENT DOCUMENTS

CN      1424869 A    6/2003
CN    101018446 A    8/2007
(Continued)

OTHER PUBLICATIONS

English Translation of WO 2020119471, Published date is Jun. 18, 2020. (Year: 2020).*

(Continued)

*Primary Examiner* — Sean Kayes
*Assistant Examiner* — Nusrat Quddus
(74) *Attorney, Agent, or Firm* — KIRTON McCONKIE; Evan R. Witt

(57) ABSTRACT

A power converter module includes a multilayer printed circuit board, a switching device, a controlling device and a capacitor device. The switching device includes two switching circuit combinations. Each of the switching circuit combinations includes two switching circuits connected in parallel. Each of the switching circuits includes a switching unit. The controlling device is configured for outputting a first control signal and a second control signal to control the switching circuits of the first switching circuit combination and the switching circuits of the second switching circuit combination respectively. The first control signal and the second control signal are out of phase with each other. On a direction, the switching units of the first switching circuit combinations and the switching units of the second switching circuit combinations are alternately arranged, each of a plurality of capacitors of the capacitor device is neighboring to the two adjacent switching units.

14 Claims, 20 Drawing Sheets

(51) Int. Cl.
  *H02M 7/5395*   (2006.01)
  *H05K 1/16*   (2006.01)

(58) Field of Classification Search
  CPC .... H01F 27/2804; H01F 27/02; H01F 27/292;
    H01F 27/24; H01F 27/28; H01F 27/255;
    H01F 27/2823; H01F 27/40; H01F
    27/306; H01F 41/06; H01F 3/10
  See application file for complete search history.

(56) References Cited

U.S. PATENT DOCUMENTS

| | | | |
|---|---|---|---|
| 11,862,377 B2 * | 1/2024 | Tan | H01F 41/06 |
| 2014/0347825 A1 | 11/2014 | Guo et al. | |
| 2015/0282370 A1 | 10/2015 | Yang | |
| 2020/0084878 A1 | 3/2020 | Pando Rodriguez et al. | |
| 2020/0113059 A1 * | 4/2020 | Xiong | G06F 1/183 |
| 2020/0305285 A1 | 9/2020 | Xiong et al. | |
| 2022/0352826 A1 * | 11/2022 | Leng | H02M 3/33571 |
| 2023/0396158 A1 * | 12/2023 | Huang | H05K 1/181 |
| 2024/0235585 A1 * | 7/2024 | Kogure | H03F 1/02 |
| 2024/0275259 A1 * | 8/2024 | Zeng | G01R 19/32 |
| 2024/0364205 A1 * | 10/2024 | Ye | H02M 3/156 |
| 2025/0038674 A1 * | 1/2025 | Tera | H02M 7/797 |

FOREIGN PATENT DOCUMENTS

| | | | | |
|---|---|---|---|---|
| CN | 100584144 C | 1/2010 | | |
| CN | 103298258 A | 9/2013 | | |
| CN | 102163926 B | 8/2014 | | |
| CN | 103312174 B | 6/2016 | | |
| CN | 103795384 B | 4/2017 | | |
| CN | 107464785 A | 12/2017 | | |
| CN | 108400716 A | 8/2018 | | |
| CN | 109686538 A | * | 4/2019 | H01F 27/24 |
| CN | 110649918 A | 1/2020 | | |
| CN | 110896269 A | 3/2020 | | |
| CN | 107785360 B | 4/2020 | | |
| CN | 107785361 B | 6/2020 | | |
| CN | 111313655 A | 6/2020 | | |
| CN | 111357182 A | 6/2020 | | |
| CN | 211744882 U | 10/2020 | | |
| CN | 114513107 A | 5/2022 | | |
| EP | 3882936 A1 | * | 9/2021 | H01F 27/24 |
| JP | 2020005365 A | 1/2020 | | |
| KR | 20160149454 A | 12/2016 | | |
| WO | WO-2020119471 A1 | * | 6/2020 | H01F 27/24 |

OTHER PUBLICATIONS

English Translation of CN-109686538, Date Published on Apr. 26, 2019. (Year: 2019).*

* cited by examiner

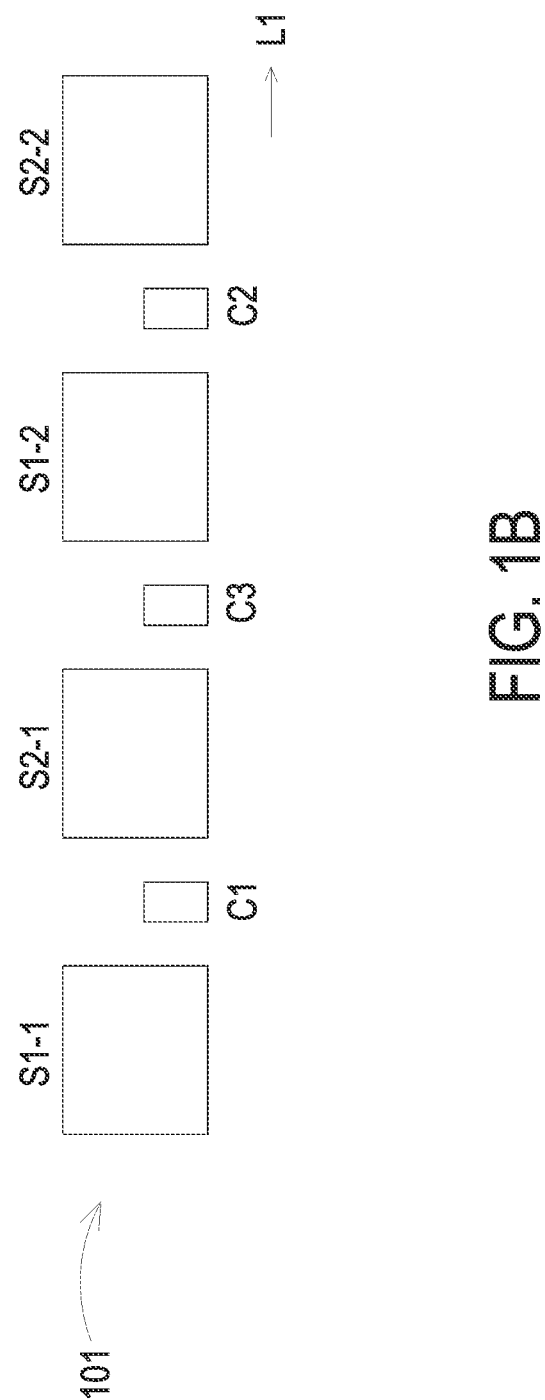

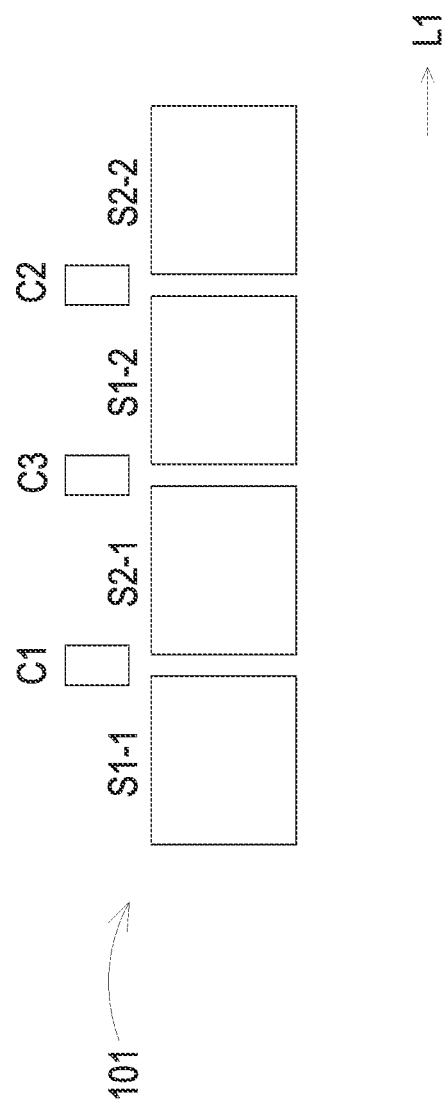

POWER MODULE WITH ALTERNATELY ARRANGED SWITCHING UNITS

CROSS-REFERENCE TO RELATED APPLICATION

This application claims priorities to China Patent Application No. 202011164463.3, filed on Oct. 27, 2020, and China Patent Application No. 202011463191.7, filed on Dec. 11, 2020, the entire content of which is incorporated herein by reference for all purposes.

FIELD OF THE INVENTION

The present disclosure relates to a power converter module, and more particularly to a power converter module in which switching circuits in different switching circuit combinations are alternately arranged.

BACKGROUND OF THE INVENTION

With the rapid development of technologies such as mobile communications and cloud computing, high-power power converter modules have been widely used in electronic products. Due to the trend of high power and miniaturization of electronic products, how to improve the conversion efficiency of the power converter module and reduce the size of the power converter module is the primary consideration.

In the conventional power converter module, in order to meet the demand for high-power output, the N-phase power converter units are usually connected in parallel, and the control signals of the N-phase power converter units are sequentially out of phase by 360/N degrees. Thus, the current ripple of input and output are reduced, and the required number of input and output capacitors is reduced, thereby reducing the size of the power converter module and increasing the power density. However, as the required output power increases, the number of phase-staggered control signals output by the controller reaches the upper limit, and the phase number of phase-staggered parallel connections in the power converter units is therefore limited.

Therefore, there is a need of providing a power converter module to obviate the drawbacks encountered from the prior arts.

SUMMARY OF THE INVENTION

It is an object of the present disclosure to provide a power converter module including a plurality of switching circuit combinations and a plurality of capacitors. The plurality of switching circuit combinations are controlled by the corresponding control signals, and each switching circuit combination includes a plurality of switching circuits. The switching circuits from different switching circuit combinations are alternately arranged, and the capacitor is disposed between the corresponding switching circuits. Therefore, when the switching circuit combination is activated by the corresponding control signal, the switching circuits of the switching circuit combination extract charges from different capacitors respectively. In addition, the control signals corresponding to different switching circuit combinations are partially out of phase with each other, so the AC currents flowing through the same capacitor can be partially cancelled by each other. As a result, the power converter module of the present disclosure can achieve the same power conversion efficiency with a smaller number of capacitors. Further, the current ripple, the AC loss and the size of the power converter module are reduced, thereby improving the power conversion efficiency of the power converter module.

In accordance with an aspect of the present disclosure, there is provided a power converter module. The power converter module includes a multilayer printed circuit board, a switching device, a controlling device and a capacitor device. The multilayer printed circuit board has a first surface and a second surface, the first surface and the second surface are opposite. The switching device includes two switching circuit combinations and is disposed on the first surface of the multilayer printed circuit board. Each of the switching circuit combinations includes at least two switching circuits, and the switching circuits are in parallel. Each of the switching circuits includes a switching unit. Wherein two switching circuit combinations include a first switching circuit combination and a second switching circuit combination. The controlling device is configured for outputting a first control signal and a second control signal to control the switching circuits of the first switching circuit combination and the switching circuits of the second switching circuit combination respectively, wherein the first control signal and the second control signal are out of phase. The capacitor device is electrically paralleled with an input terminal of the power converter module, wherein the capacitor device includes a plurality of capacitors and is disposed on the first surface of the multilayer printed circuit board. Wherein on a direction, the switching units of the first switching circuit combinations and the switching units of the second switching circuit combinations are alternately arranged, the plurality of capacitors of the capacitor device are neighboring to the two adjacent switching units respectively.

The above contents of the present invention will become more readily apparent to those ordinarily skilled in the art after reviewing the following detailed description and accompanying drawings, in which:

BRIEF DESCRIPTION OF THE DRAWINGS

FIG. 1B schematically shows an arrangement of the switching circuits of FIG. 1A according to an embodiment of the present disclosure;

FIG. 1D schematically shows an arrangement of the switching circuits and the capacitors according to another embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
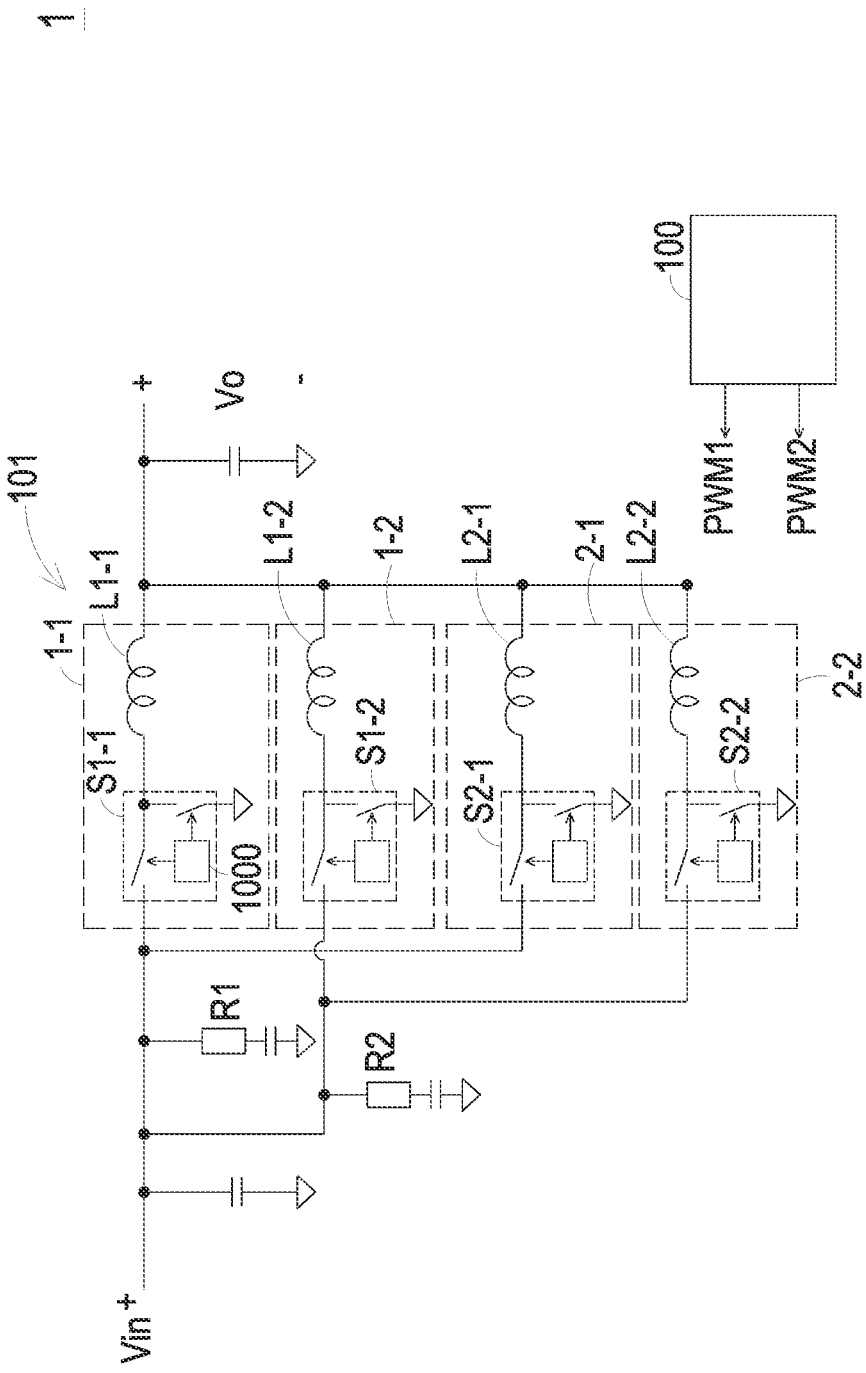
FIG. 1A is a schematic circuit diagram illustrating the power converter module 1 according to an embodiment of the present disclosure.

FIG. 1A is a schematic circuit diagram illustrating the power converter module 1 according to an embodiment of the present disclosure. The power converter module 1 includes a switching device 101, a capacitor device and a controlling device 100. The switching device 101 includes a plurality of switching circuit combinations. As shown in FIG. 1A, the plurality of switching circuit combinations include a first switching circuit combination and a second switching circuit combination. The first switching circuit combination and the second switching circuit combination are parallel connected to an input terminal of the power converter module 1. The capacitor device includes a plurality of capacitors. The plurality of capacitors are parallel connected with each other, and the plurality of capacitors are parallel connected to the input terminal of the power converter module 1 and are regarded as the input capacitors of the power converter module 1. Thereby, the ripple of the input current is reduced, so as to achieve the purpose of reducing AC loss. The controlling device 100 is configured for outputting a plurality of control signals to control the plurality of switching circuit combinations respectively.

The first switching circuit combination includes at least two switching circuits such as the switching circuit 1-1 and the switching circuit 1-2 in FIG. 1A. The second switching circuit combination includes at least two switching circuits such as the switching circuit 2-1 and the switching circuit 2-2 in FIG. 1A. The switching circuits are in parallel with each other. In each switching circuit combination, the control signals of different switching circuits are the same. The number of switching circuit combinations of the switching device 101 is not limited, and the number of the switching circuits in each of the switching circuit combinations is also not limited. In the following, as an example for description, the switching device 101 includes two switching circuit combinations, and each switching circuit combination includes two switching circuits.

In the embodiment of FIG. 1A, the switching circuits 1-1 and 1-2 of the first switching circuit combination and the switching circuits 2-1 and 2-2 of the second switching circuit combination are in parallel with each other. The first ends of the switching circuits of each switching circuit combination, such as the first end of the switching circuit 1-1, the first end of the switching circuit 1-2, the first end of the switching circuit 2-1 and the first end of the switching circuit 2-2, are electrically connected with each other and are electrically connected to an end of the capacitor device. The other end of the capacitor device is grounded. The second ends of the switching circuits of each switching circuit combination are electrically connected with each other and are electrically connected to the output terminal of the power converter module 1.

The controlling device 100 is configured to output a first control signal PWM1 and a second control signal PWM2. The first control signal PWM1 controls the plurality of switching circuits of the first switching circuit combination, for example, the switching circuits 1-1 and 1-2. The second control signal PWM2 controls the plurality of switching circuits of the second switching circuit combination, for example, the switching circuits 2-1 and 2-2.

Please refer to FIG. 1A. Each switching circuit includes a switching unit and an inductor. The switching circuit 1-1 includes a switching unit S1-1 and an inductor L1-1. The switching circuit 1-2 includes a switching unit S1-2 and an inductor L1-2. The switching circuit 2-1 includes a switching unit S2-1 and an inductor L2-1. The switching circuit 2-2 includes a switching unit S2-2 and an inductor L2-2. The control signal PWM1 controls the switching units S1-1 and S1-2, and the control signal PWM2 controls the switching units S2-1 and S2-2. Each of the switching units has a driving device 1000 correspondingly, and the driving device 1000 is controlled by the controlling device 100.

In an embodiment, the capacitor device includes a first capacitor C1, a second capacitor C2 and a third capacitor C3. The first capacitor C1, the second capacitor C2 and the third capacitor C3 are in parallel with each other. One end of the first capacitor C1, one end of the second capacitor C2 and one end of the third capacitor C3 are electrically connected with each other and are electrically connected to the first end of each switching circuit. The other end of the first capacitor C1, the other end of the second capacitor C2 and the other end of the third capacitor C3 are grounded. The first capacitor C1, the second capacitor C2, or the third capacitor C3 can be one capacitor or the equivalent capacitor of multiple adjacent capacitors. Furthermore, the capacitance of the first capacitor C1, the second capacitor C2, or the third capacitor C3 is not limited, and it can be designed according to actual requirements.

FIG. 1B schematically shows an arrangement of the switching circuits of FIG. 1A according to an embodiment of the present disclosure. The switching circuits of each switching circuit combination are disposed on the multilayer printed circuit board, for example, the multilayer printed circuit board in FIG. 4A. On the multilayer printed circuit board, the relative position of the switching circuits is shown in FIG. 1B. The switching units S1-1, S2-1, S1-2 and S2-2 are arranged in order along a first direction L1. The first capacitor C1 is neighboring to the switching units S1-1 and S2-1. The third capacitor C3 is neighboring to the switching units S2-1 and S1-2. The second capacitor C2 is neighboring to the switching units S1-2 and S2-2. In this embodiment, the first capacitor C1 is disposed between the switching units S1-1 and S2-1, the third capacitor C3 is disposed between the switching units S2-1 and S1-2, and the second capacitor C2 is disposed between the switching units S1-2 and S2-2. However, the positions of the first capacitor C1, the second capacitor C2 and the third capacitor C3 are not limited thereto and can be determined according to the actual situation. It only needs to satisfy that on the first direction L1, the first capacitor C1 is disposed adjacent to the switching units S1-1 and S2-1, the second capacitor C2 is disposed adjacent to the switching units S1-2 and S2-2, and the third capacitor C3 is disposed adjacent to the switching units S2-1 and S1-2. For example, the first capacitor C1, the second capacitor C2 and the third capacitor C3 can be disposed according to the arrangement shown in FIG. 1C or FIG. 1D.

In an embodiment, the first direction L1 is a straight line direction, for example, the long side direction or the short side direction of the multilayer printed circuit board.

Figure 1C:
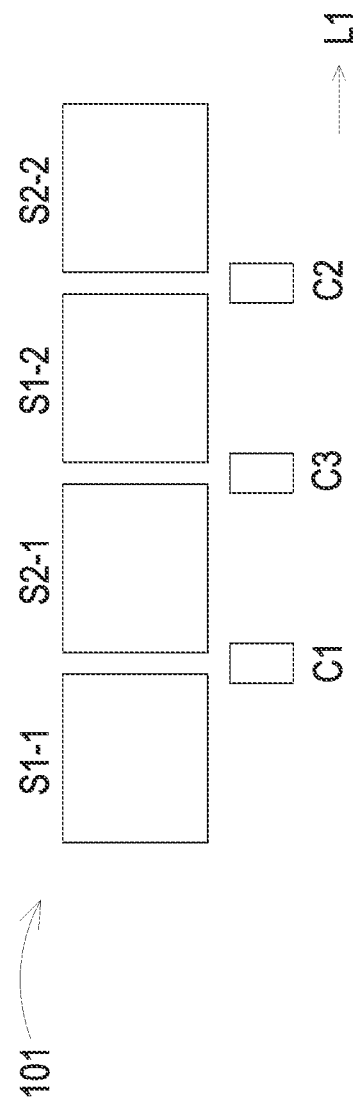
FIG. 1C schematically shows an arrangement of the switching circuits and the capacitors according to another embodiment of the present disclosure.
Figure 1E:
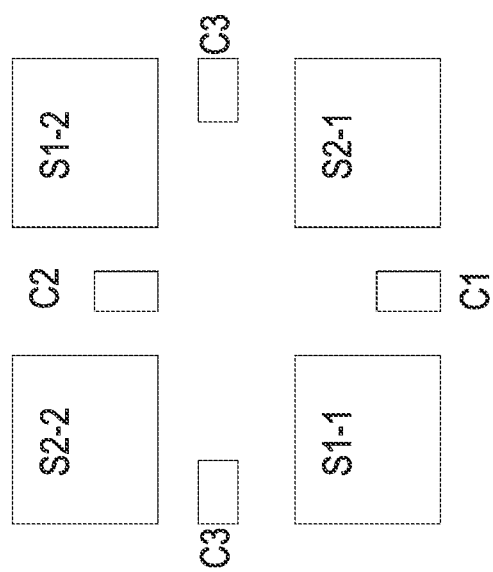
FIG. 1E schematically shows an arrangement of the switching circuits of FIG. 1A arranged in a circular direction.

In another embodiment, the plurality of switching circuits are not limited to be arranged in a straight line. As shown in FIG. 1E, the switching units S1-1, S2-1, S1-2, and S2-2 are arranged in a circular direction. The first capacitor C1 is disposed adjacent to the switching units S1-1 and S2-1. Apart of the third capacitors C3 is disposed adjacent to the switching units S2-1 and S1-2. The other part of the capacitors C3 is disposed adjacent to the switching units S1-1 and S2-2. The second capacitor C2 is disposed adjacent to the switching units S1-2 and S2-2. Similar to the relative positions of the capacitors and switching units in FIGS. 1B-1D, the first capacitor C1, the second capacitor C2 and the third capacitor C3 in FIG. 1E don't have to be disposed in the middle of two switching units, but only need to be disposed adjacent to the corresponding switching units.

Please refer to FIGS. 1A and 1B. It is supposed that the AC currents flowing through the switching circuits 1-1 and 1-2 of the first switching circuit combination are i1-1 and i1-2 respectively, and the AC currents flowing through the switching circuits 2-1 and 2-2 of the second switching circuit combination are i2-1 and i2-2 respectively. Since the first capacitor C1, the second capacitor C2 and the third capacitor C3 are connected in parallel between the first end of each switching circuit and the ground, the sum of the AC currents flowing through the first capacitor C1, the second capacitor C2 and the third capacitor C3 is equal to the sum of the AC currents i1-1, i1-2, i2-1 and i2-2. All or a part of the AC currents i1-1 and i2-1 flow through the first capacitor C1, and all or a part of the AC currents i1-2 and i2-2 flow through the second capacitor C2. As a result, when the first control signal PWM1 controls the switching units S1-1 and S1-2 to be turned on simultaneously, the switching units S1-1 and S1-2 extract charges from the first capacitor C1 and the second capacitor C2 respectively. When the second control signal PWM2 controls the switching units S2-1 and S2-2 to be turned on simultaneously, the switching units S2-1 and S2-2 extract charges from the first capacitor C1 and the second capacitor C2 respectively. Further, the first control signal PWM1 and the second control signal PWM2 are out of phase with each other. Accordingly, the switching units S1-1 and S2-1 do not extract charges from the first capacitor C1 simultaneously, the switching units S1-2 and S2-2 do not extract charges from the first capacitor C2 simultaneously, and the switching units S2-1 and S1-2 do not extract charges from the first capacitor C3 simultaneously. Therefore, the AC current ripple cancellation effect exists on the first capacitor C1, the second capacitor C2 and the third capacitor C3.

Figure 1F:
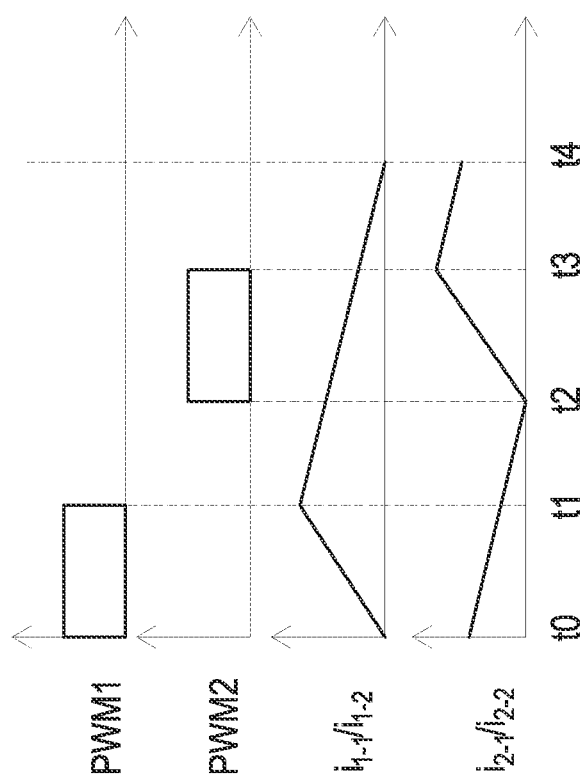
FIG. 1F is a schematic oscillogram illustrating the currents in the power converter module 1 of FIG. 1A.

Please refer to FIG. 1F. FIG. 1F is a schematic oscillogram illustrating the currents in the power converter module 1 of FIG. 1A. The first control signal PWM1 controls the switching units S1-1 and S1-2 to be turned on simultaneously, and the second control signal PWM2 controls the switching units S2-1 and S2-2 to be turned on simultaneously. Consequently, the AC currents i1-1 and i1-2 are the same, and the AC currents i2-1 and i2-2 are the same. As shown in FIG. 1F, the first control signal PWM1 and the second control signal PWM2 are out of phase with each other. Therefore, in the interval t0-t1 and the interval t2-t3, the trends of the AC current i1-1 and the AC current i2-1 are opposite, so the AC currents flowing through the first capacitor C1 are partially cancelled by each other. Similarly, in the interval t0-t1 and the interval t2-t3, the trends of the AC current i1-2 and the AC current i2-2 are opposite, so the AC currents flowing through the second capacitor C2 are also partially cancelled by each other. Thereby, the effect of reducing the input current ripple is achieved, and the AC loss caused by the current ripple is reduced. Therefore, with the arrangement in this embodiment, under the same input current ripple magnitude, a capacitor with smaller capacitance value or a smaller number of capacitors can be selected to achieve the required ripple effect. Further, the loss and size of the power converter module can be reduced.

In another embodiment, the first control signal PWM1 and the second control signal PWM2 are 180 degrees out of phase with each other, but not limited thereto. The out-of-phase angle can be set according to specific conditions.

In the power converter module 1 of the present disclosure, the switching circuits in different switching circuit combinations are arranged alternately, and the capacitors are disposed adjacent to the corresponding switching circuits in different switching circuit combinations. Therefore, when the switching circuit combination is activated under the control of the corresponding control signal, switching circuits in each switching circuit combination extracts charges from different capacitors respectively. In addition, the control signals corresponding to different switching circuit combinations are partially out of phase with each other, so the AC currents flowing through the same capacitor can be partially cancelled. As a result, the power converter module of the present disclosure can achieve the same power conversion efficiency with a smaller number of capacitors, and the current ripple, AC loss, and the size of the power converter module are reduced, thereby improving the power conversion efficiency of the power converter module.

Figure 2A:
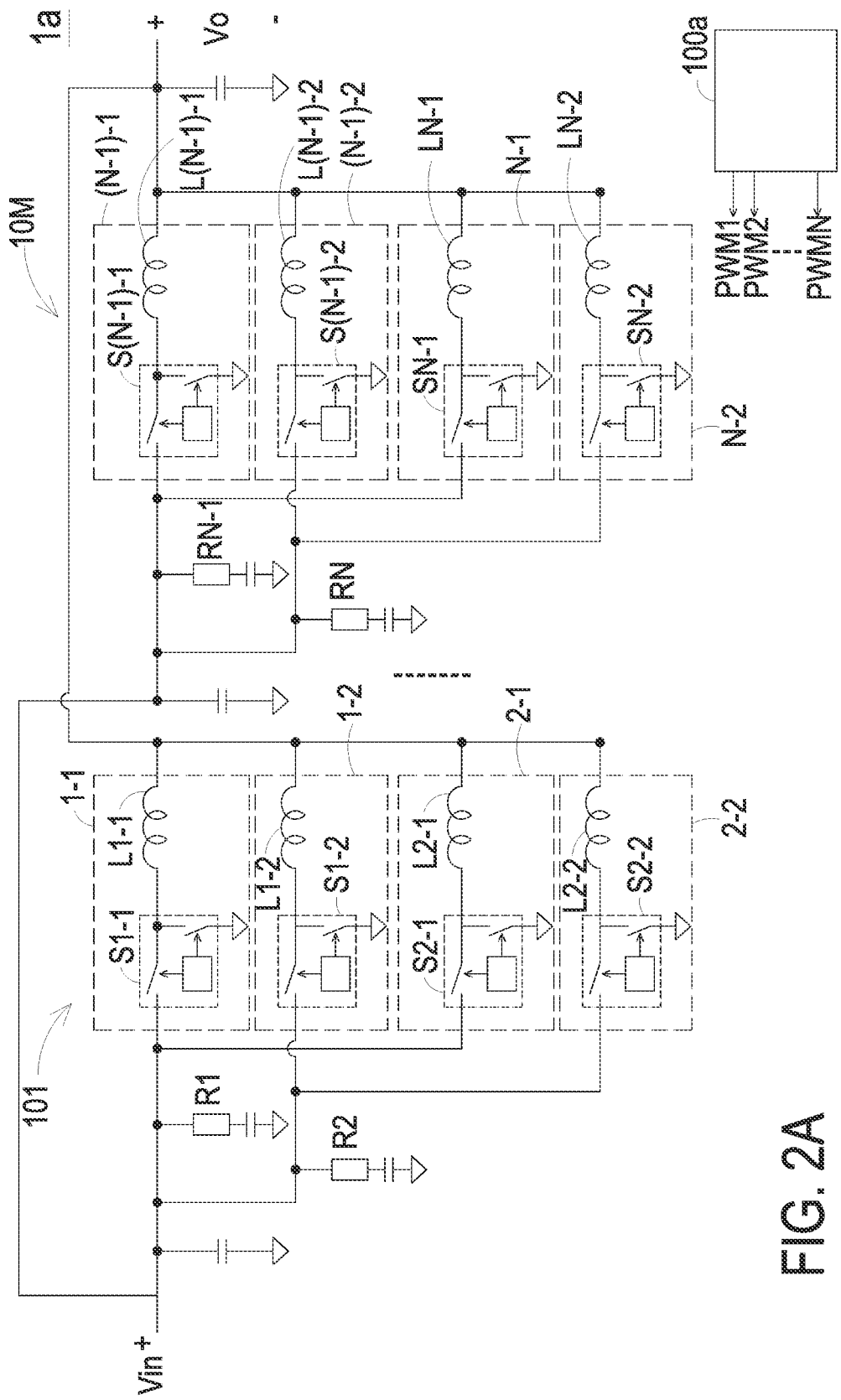
FIG. 2A is a schematic circuit diagram illustrating the power converter module 1a according to another embodiment of the present disclosure.

In another embodiment, the number of the switching devices of the power converter module 1 is not limited to one. The implementation of the power converter module 1a including M switching devices is exemplified as follow. As shown in FIG. 2A, the power converter module 1a includes M switching devices 101-10M, where M is a positive integer greater than 2. The M switching devices 101-10M are connected in parallel with each other, and the first ends of the M switching devices are commonly connected to one end of the capacitor device, and the other end of the capacitor device is grounded. The connection relations of each switching device can be referred to that shown in FIG. 1A, and the detailed descriptions thereof are omitted herein. The M-th switching device 10M includes an (N−1)-th switching circuit combination and an N-th switching circuit combination, where the number of N is twice the number of M. The (N−1)-th switching circuit combination includes two switching circuits (N−1)-1 and (N−1)-2, and the corresponding switching units are S(N−1)-1, S(N−1)-2. The N-th switching circuit combination includes two switching circuits N-1 and N-2, and the corresponding switching units are SN-1 and SN-2 respectively.

Figure 2B:
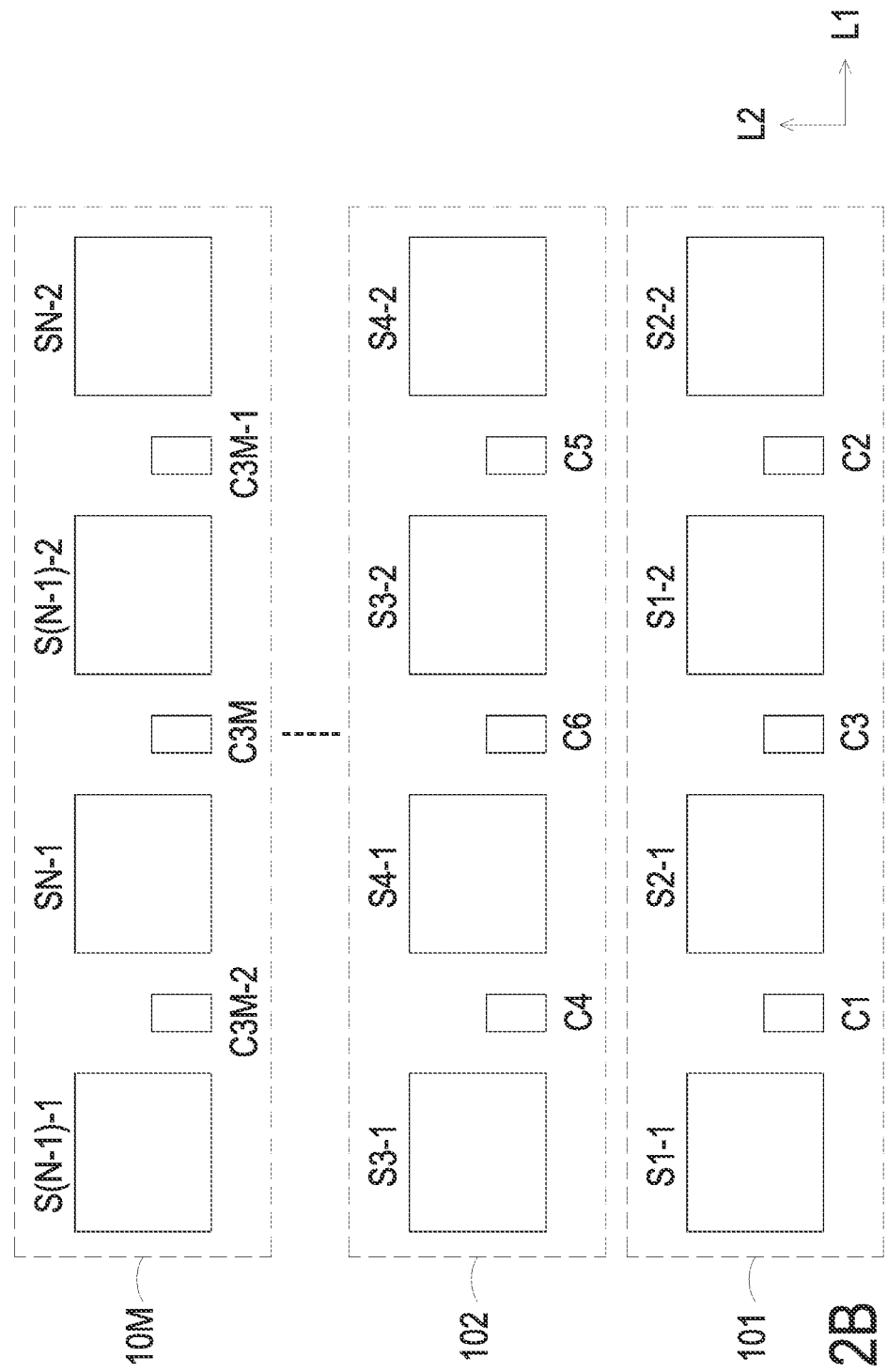
FIG. 2B schematically shows an arrangement of the switching circuits of FIG. 2A.

Please refer to FIGS. 2A and 2B. The capacitor device of the power converter module 1a includes 3M capacitors, which are the first capacitor C1, the second capacitor C2, the third capacitor C3, ..., the (3M−2)-th capacitor C(3M−2), the (3M−1)-th capacitor C(3M−1) and the (3M)-th capacitor C(3M).

Please refer to FIG. 2B. FIG. 2B schematically shows an arrangement of the switching circuits of FIG. 2A. Each of the switching circuit devices is disposed on the multilayer printed circuit board, for example, the multilayer printed circuit board 10 in FIG. 4A. On the multilayer printed circuit board, M switching devices 101-10M are stacked along a second direction L2, where the second direction L2 is perpendicular to the first direction L1. The arrangement of the switching units of each switching device is shown as FIG. 1B, the switching units of different switching circuit combinations in each switching device are arranged alternately along the first direction L1. For example, the switching units S1-1, S2-1, S1-2 and S2-2 of the switching device 101 are arranged in order along the first direction L1. The switching units S3-1, S4-1, S3-2 and S4-2 of the switching device 102 are arranged in order along the first direction L1. Similarly, the switching units S(N−1)-1, SN-1, S(N−1)-2 and SN-2 of the switching device 10M are arranged in order along the first direction L1.

Please refer to FIG. 2B again, the capacitors of the capacitor device are disposed on the multilayer printed circuit board and each capacitor is disposed adjacent to the adjacent switching units respectively. In the switching device 101, the first capacitor C1 is disposed adjacent to the switching units S1-1 and S2-1, the second capacitor C2 is disposed adjacent to the switching units S1-2 and S2-2, and the third capacitor C3 is disposed adjacent to the switching units S2-1 and S1-2. In the switching device 102, the fourth capacitor C4 is disposed adjacent to the switching units S3-1 and S4-1, the fifth capacitor C5 is disposed adjacent to the switching units S3-2 and S4-2, and the sixth capacitor C6 is disposed adjacent to the switching units S4-1 and S3-2. Therefore, in the switching device 10M, the (3M−2)-th capacitor C(3M−2) is disposed adjacent to the switching units S(N−1)-1 and SN-1, and the (3M−1)-th capacitor C(3M−1) is disposed adjacent to the switching units S(N−1)-2 and SN-2, and the 3M-th capacitor C3M is disposed adjacent to the switching units SN-1 and S(N−1)-2.

The controlling device 100a of the power converter module 1a is configured for outputting the control signals PWM1-PWMN to control N switching circuit combinations respectively. Wherein the control signals PWM1-PWMN are out of phase with each other. Combined with the above-mentioned alternately arrangement of the switching circuits, the control signals of the two adjacent switching circuits are out of phase, and the two adjacent switching circuits do not extract charges from the adjacent capacitor simultaneously, so as to achieve the purpose of reducing the input current ripple.

Figure 3A:
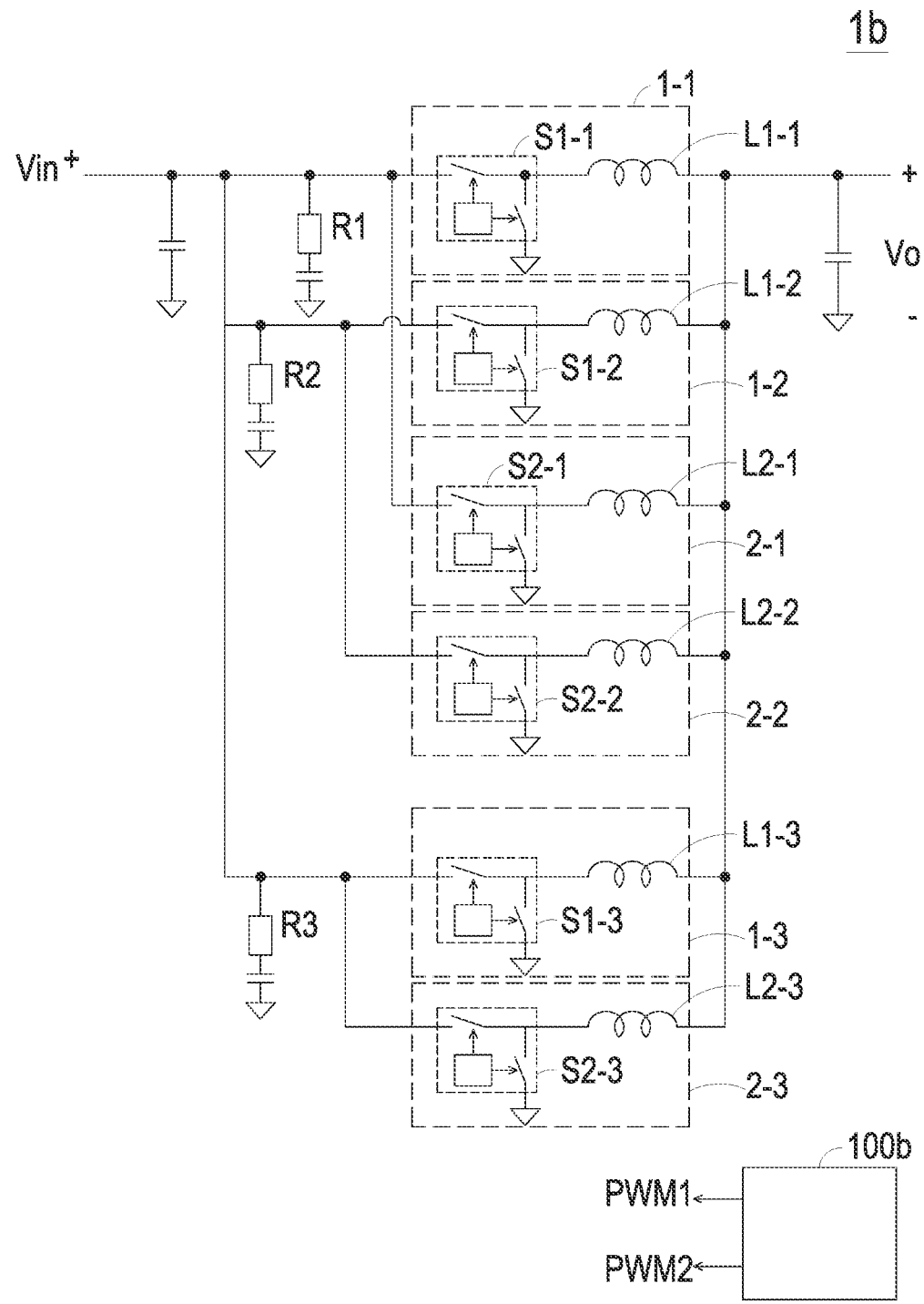
FIG. 3A is a schematic circuit diagram illustrating the power converter module 1b according to another embodiment of the present disclosure.
Figure 3B:
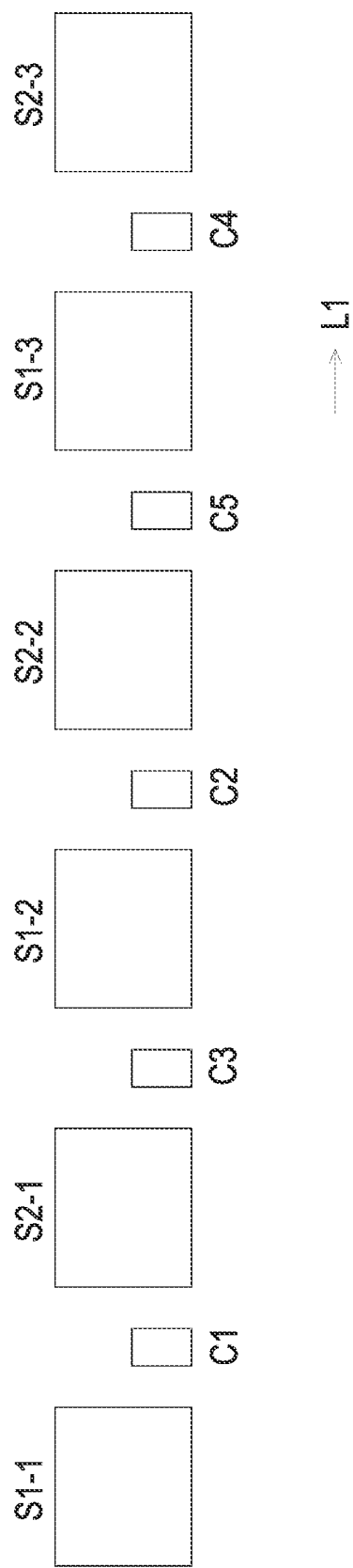
FIG. 3B schematically shows an arrangement of the switching circuits where the switching circuits are arranged in a straight line direction.
Figure 3C:
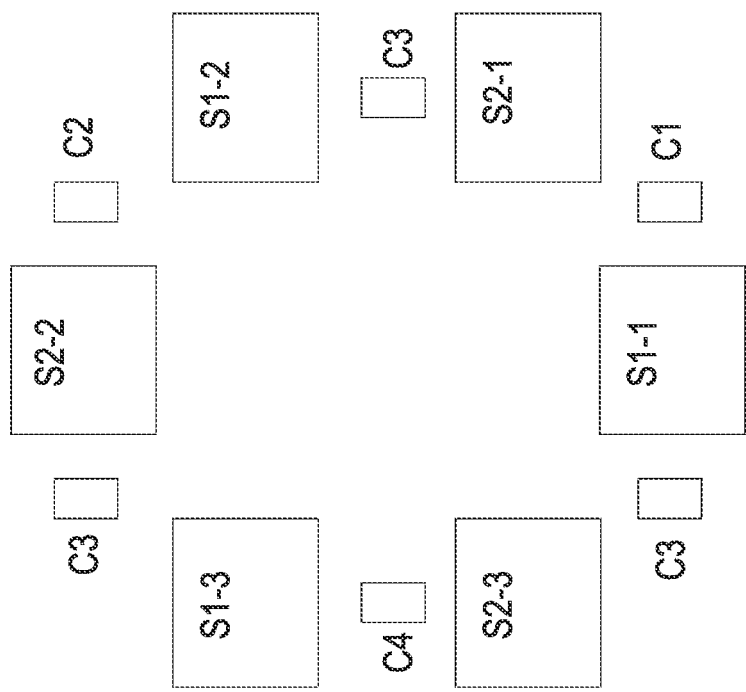
FIG. 3C schematically shows an arrangement of the switching circuits where the switching circuits are arranged in a circular direction.

In another embodiment, the number of the switching circuits in each switching circuit combination of the power converter module 1 is not limited to two. The implementation of the first switching circuit combination of the power converter module 1b including three switching circuits 1-1, 1-2, 1-3 and the second switching circuit combination including three switching circuits 2-1, 2-2, and 2-3 is exemplified as follow. The capacitor device includes five capacitors, the first capacitor C1, the second capacitor C2, the third capacitor C3, the fourth capacitor C4 and the fifth capacitor C5. As shown in FIGS. 3A and 3B, each of the switching circuits is in parallel with each other. Wherein the switching circuits 1-1, 1-2, 1-3, 2-1, 2-2 and 2-3 include a switching unit S1-1, S1-2, S1-3, S2-1, S2-2 and S2-3 respectively. As shown in FIG. 3B, the switching units S1-1, S2-1, S1-2, S2-2, S1-3 and S2-3 are disposed on the multilayer printed circuit board and are arranged in order along the first direction L1. The first capacitor C1 is neighboring to the switching units S1-1 and S2-1, the second capacitor C2 is neighboring to the switching units S1-2 and S2-2, the fourth capacitor C4 is neighboring to the switching units S1-3 and S2-3, the third capacitor C3 is neighboring to the switching units S2-1 and S1-2 and the fifth capacitor C5 is neighboring to the switching units S2-2 and S1-3. The controlling device 100b is configured for outputting the first control signal PWM1 and the second control signal PWM2 to control the switching units of the corresponding switching circuit combinations respectively. In another embodiment, as shown in FIG. 3C, the switching units S1-1, S2-1, S1-2, S2-2, S1-3 and S2-3 are arranged in order in circular direction, the capacitors of the capacitor device are arranged neighboring to the adjacent switching units respectively, and the arrangement principles can be referred to as shown in FIGS. 1C and 3B, and will not be omitted herein.

Figure 3D:
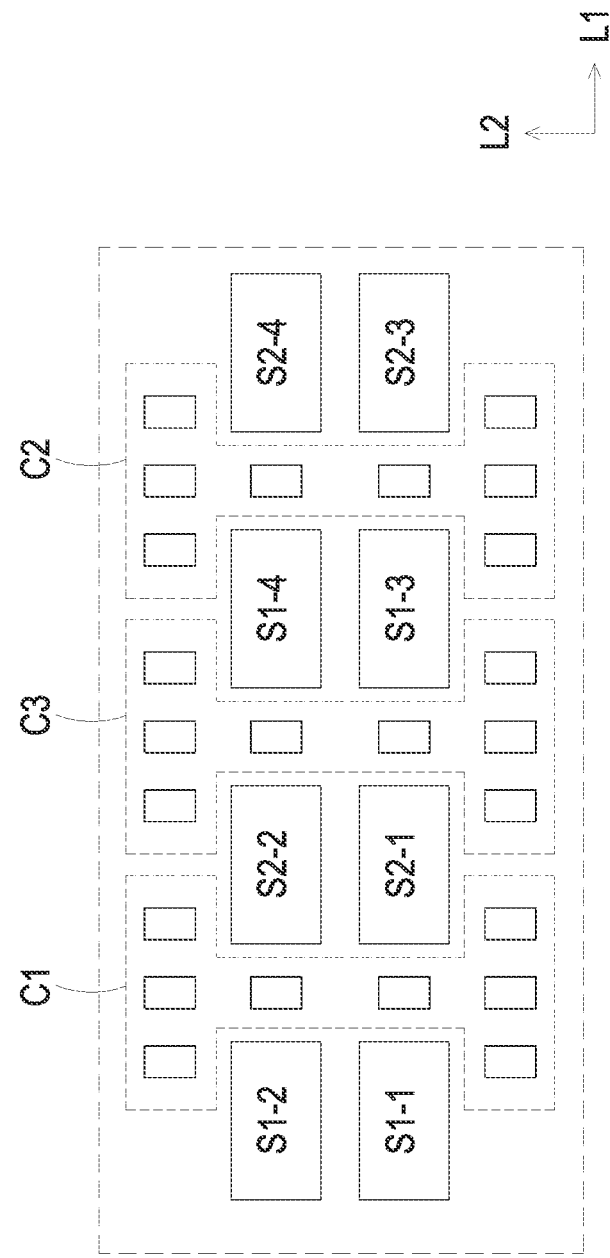
FIG. 3D schematically shows an arrangement of the switching circuits according to another embodiment of the present disclosure.
Figure 3E:
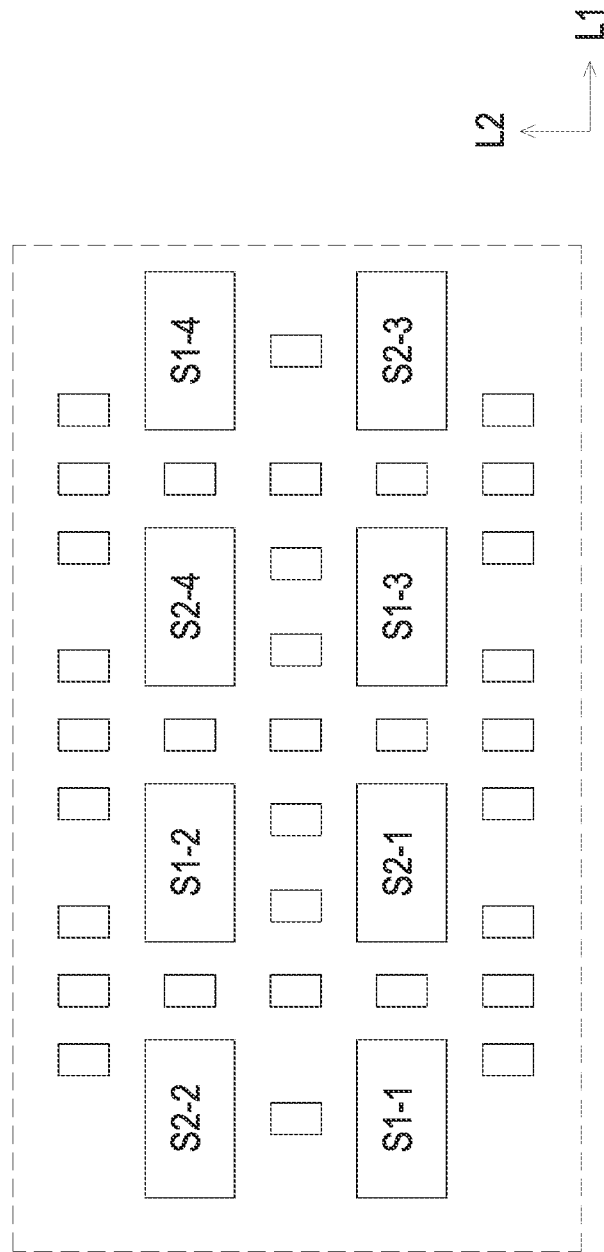
FIG. 3E schematically shows an arrangement of the switching circuits according to another embodiment of the present disclosure.

In another embodiment, the number of the switching circuits of each switching circuit combination of the power converter module is four. The implementation of the power converter module including one switching device is exemplified as follow. The circuit diagram of the switching device can refer to FIGS. 1A and 3A, the difference is that each switching circuit combination includes four switching circuits. The power converter module includes two control signals PWM1 and PWM2, and the control signals PWM1 and PWM2 are out of phase with each other. One of the switching circuit combinations includes switching circuits 1-1, 1-2, 1-3 and 1-4 and is controlled by the control signal PWM1. Another one of the switching circuit combinations includes switching circuits 2-1, 2-2, 2-3 and 2-4 and is controlled by the control signal PWM2. The capacitor device includes plurality of capacitors, as shown in FIG. 3D, each switching circuit is connected in parallel. The switching circuits 1-1, 1-2, 1-3 and 1-4 include the switching units S1-1, S1-2, S1-3 and S1-4 respectively. The switching circuits 2-1, 2-2, 2-3 and 2-4 include the switching units S2-1, S2-2, S2-3 and S2-4 respectively. As shown in FIG. 3D, on the multilayer circuit board, the switching units S1-1, S2-1, S1-3 and S2-3 are arranged in order along the first direction L1 in a straight line direction. A part of capacitors of the capacitor device are neighboring to the switching units S1-1 and S2-1. A part of capacitors are neighboring to the switching units S2-1 and S1-3. A part of capacitors are neighboring to the switching units S1-3 and S2-3. The switching units S1-2, S2-2, S1-4 and S2-4 are arranged in order along the first direction L1 in a straight line direction. The switching units S1-1 and S2-1 are stacked in order along the second direction L2. The switching units S1-3 and S2-3 are stacked in order along the second direction L2. A part of the capacitors are neighboring to the adjacent switching units S1-2 and S2-2, a part of the capacitors are neighboring to the adjacent switching units S2-2 and S1-4, and a part of the capacitors are neighboring to the adjacent switching units S1-4 and S2-4. On the second direction L2, the relative position of the switching unit is not restricted. As shown in FIG. 3D, the switching unit S1-2 is neighboring to the switching unit S1-1, the switching unit S2-2 is neighboring to the switching unit S2-1, the switching unit S1-4 is neighboring to the switching unit S1-3, and the switching unit S2-4 is neighboring to the switching unit S2-3. In another embodiment, as shown in FIG. 3E, the switching units S2-2, S1-2, S2-4 and S1-4 are stacked on the switching units S1-1, S2-1, S1-3 and S2-3 in order along the second direction L2. The switching circuits of the above-mentioned switching device are arranged alternately along the L1 direction or along the L1 and L2 directions, so that the control signals of the adjacent switching circuits are out of phase, and the adjacent switching circuits do not simultaneously extract charges from the adjacent capacitors, thereby achieving the purpose of reducing the input current ripple.

Figure 4A:
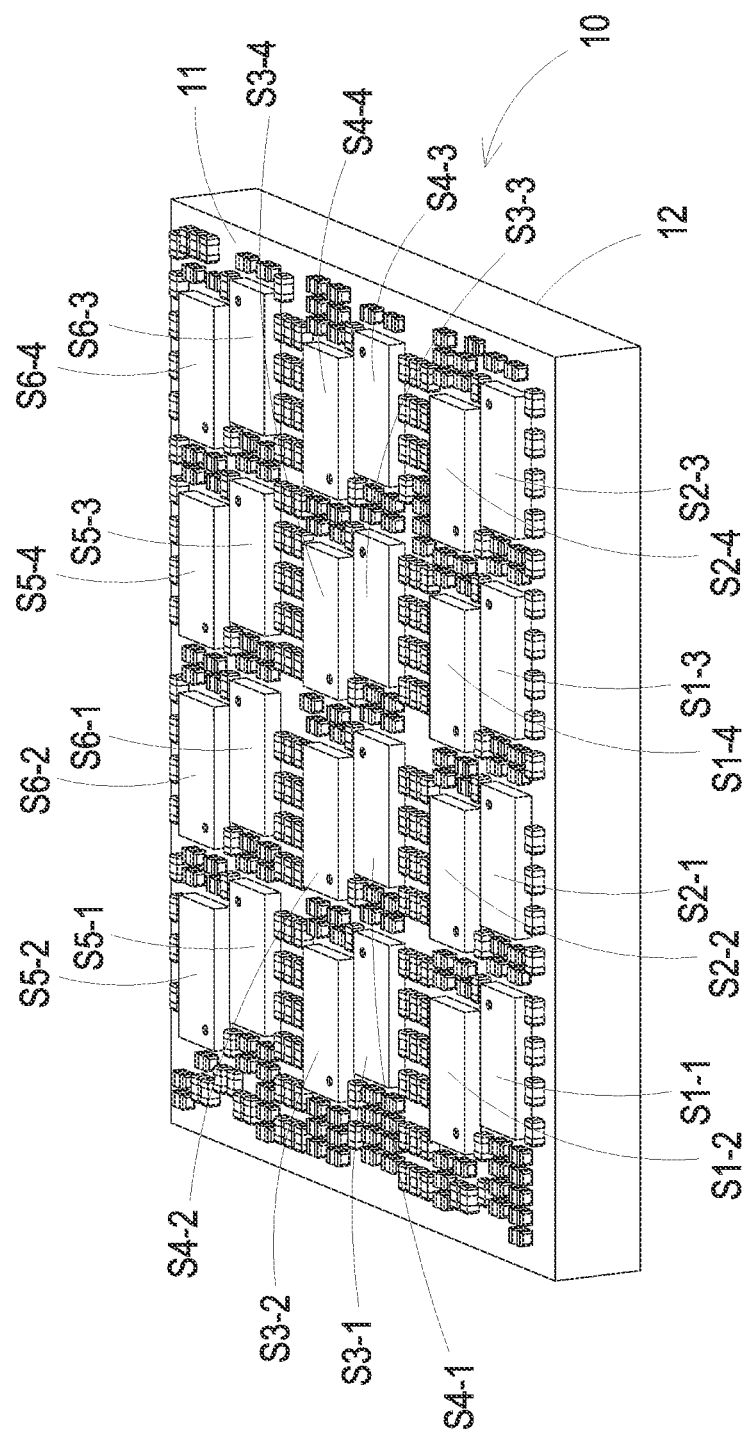
FIG. 4A is a schematic perspective view illustrating the power converter module according to another embodiment of the present disclosure.

FIG. 4A is a schematic perspective view illustrating the power converter module according to another embodiment of the present disclosure. In this embodiment, the power converter module includes three switching devices 101a, 102a and 103a. Each switching device includes two switching circuit combinations. Each switching circuit combination includes four switching circuits, but the number of the switching devices and the number of the switching circuits in each switching circuit combination are not limited.

Figure 4B:
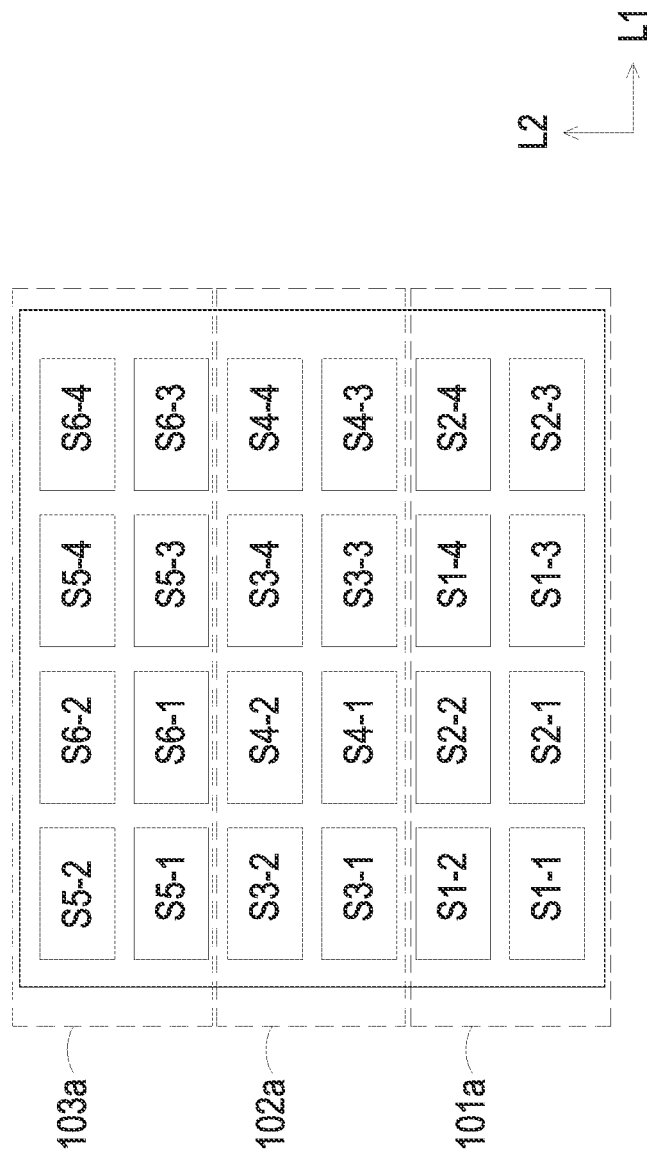
FIG. 4B schematically shows an arrangement of the switching circuits where the switching circuits are arranged in a first arrangement manner.
Figure 4C:
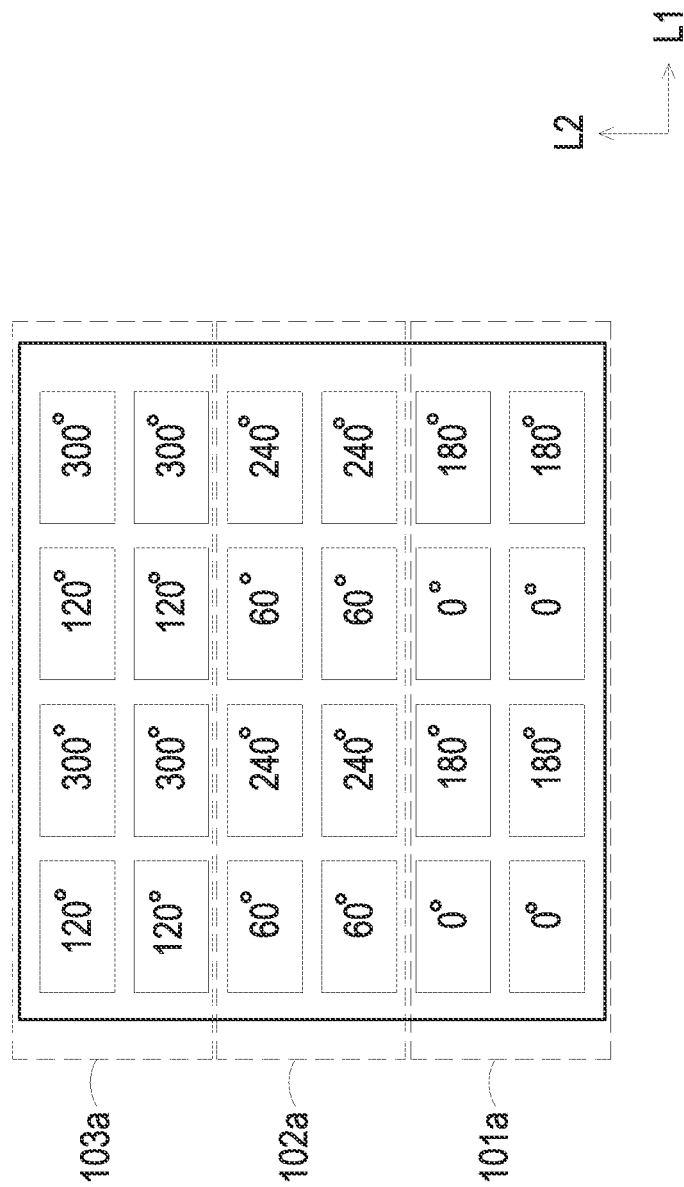
FIG. 4C is a schematic phase diagram of the control signals corresponding to the switching units in FIG. 4B.

As shown in FIGS. 4A-4C, the power converter module further includes multilayer printed circuit board 10, the multilayer printed circuit board 10 has a first side 11 and a second side 12, and the first surface 11 and the second surface 12 are opposite. The switching devices 101a, 102a and 103a are disposed on the first side 11. The switching device 101a includes a first switching circuit combination and a second switching circuit combination. The first switching circuit combination includes four switching circuits 1-1, 1-2, 1-3 and 1-4, and the second switching circuit combination includes four switching circuits 2-1, 2-2, 2-3 and 2-4. The switching device 102a includes a first switching circuit combination and a second switching circuit combination. The first switching circuit combination of the switching device 102a includes four switching circuits 3-1, 3-2, 3-3 and 3-4, the second switching circuit combination of the switching device 102a includes four switching circuits 4-1, 4-2, 4-3 and 4-4. The switching device 103a includes a first switching circuit combination and a second switching circuit combination. The first switching circuit combination of the switching device 103a includes four switching circuits 5-1, 5-2, 5-3 and 5-4, the second switching circuit combination of the switching device 103a includes four switching circuits 6-1, 6-2, 6-3 and 6-4.

In another embodiment, in the switching device 101a, the switching circuits 1-1, 1-2, 1-3, 1-4, 2-1, 2-2, 2-3 and 2-4 include switching units S1-1, S1-2, S1-3, S1-4, S2-1, S2-2, S2-3 and S2-4 respectively. The switching units S1-1, S2-1, S1-3 and S2-3 are arranged in order along the first direction L1 which is a straight line direction. The switching units S1-2, S2-2, S1-4 and S2-4 are arranged in order along the first direction L1. On the second direction L2, different switching units of the same switching circuit combination are arranged adjacently. For example, the switching units S1-1 and S1-2 in the same switching circuit combination are arranged adjacently. Therefore, the switching units S1-2, S2-2, S1-4 and S2-4 are correspondingly provided with the switching units S1-1, S2-1, S1-3 and S2-3 along the second direction L2. The switching device 102a and the switching device 103a are stacked on the switching device 101a along the second direction L2, where the switching arrangement of the switching devices 102a and 103a is the same as the switching arrangement method and sequence of the switching device 101a, and the detailed description thereof is omitted herein.

FIG. 4C is a schematic phase diagram of the control signals corresponding to the switching units in FIG. 4B. The controlling device outputs six control signals PWM1-PWM6 to control the corresponding switching circuit combination respectively. The control signals corresponding to the switching devices 101a, 102a and 103a are out of phase with each other along the second direction L2. Specifically, on the second direction L2, the control signal for controlling any switching circuit combination in the switching device 102a is partially out of phase with the control signal for controlling the corresponding switching circuit combination in the switching device 101a. The control signal for controlling any switching circuit combination in the switching device 103a is partially out of phase with the control signal for controlling the corresponding switching circuit combination in the switching device 102a. On the second direction L2, the corresponding control signals in different switching devices are partially out of phase with each other, thereby further reducing the number of input capacitors, the current ripple of the input and output, and the AC loss. In the switching device 101a of this embodiment, the control signal for controlling the first switching circuit combination and the control signal for controlling the second switching circuit combination are 180 degrees out of phase with each other. The control signal for the first switching circuit combination of the switching device 102a and the control signal for the first switching circuit combination of the switching device 101a are 60 degrees out of phase with each other. The control signal for the first switching circuit combination of the switching device 103a and the control signal for the first switching circuit combination of the switching device 102a are 60 degrees out of phase with each other. The out-of-phase angle is not limited thereto, and it only needs to satisfy that different switching circuit combinations do not simultaneously extract charges from the capacitors adjacent to the different switching circuit combinations.

Figure 4D:
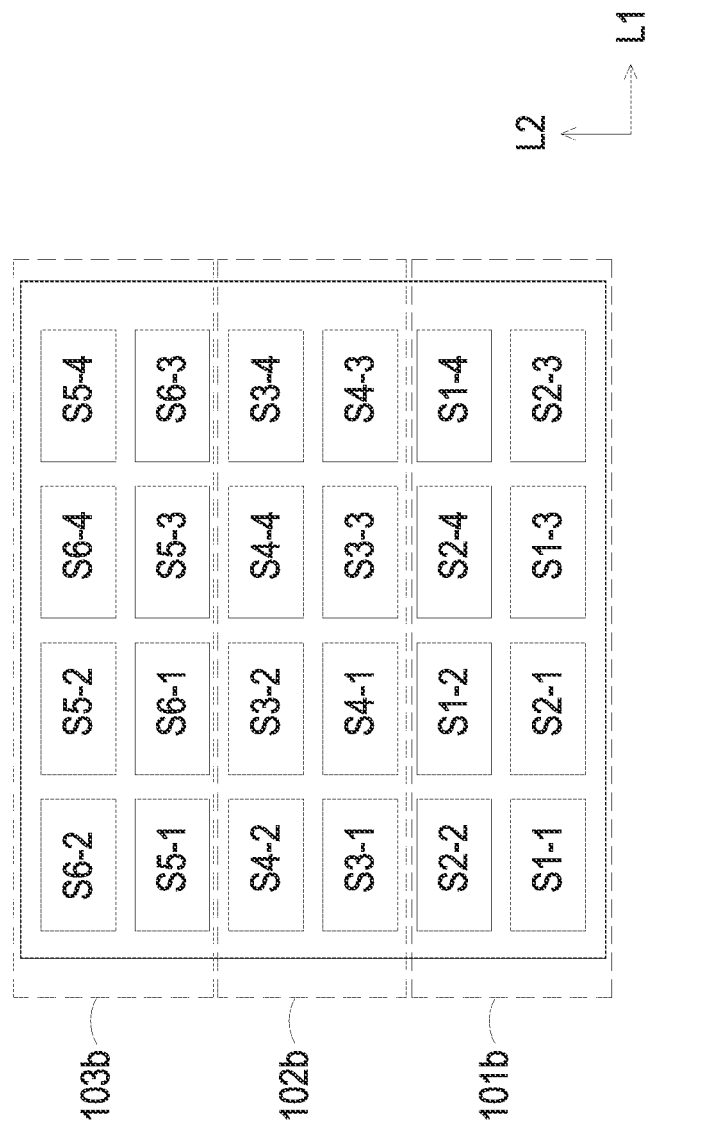
FIG. 4D schematically shows an arrangement of the switching circuits where the switching circuits are arranged in a second arrangement.
Figure 4E:
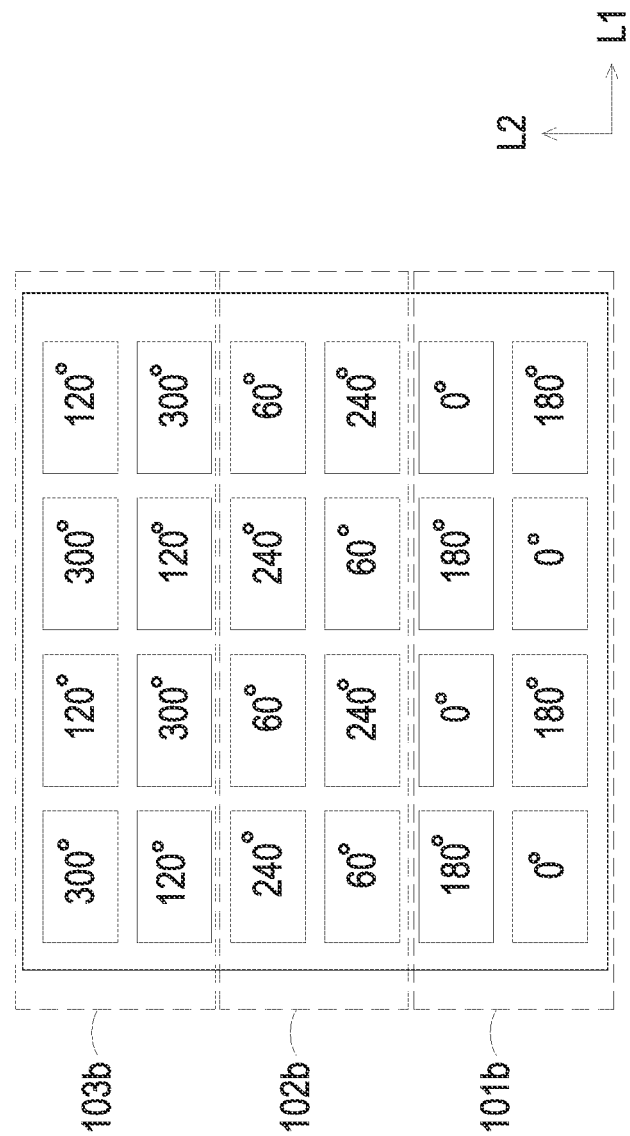
FIG. 4E is a schematic phase diagram of the control signals corresponding to the switching units in FIG. 4D.

In another embodiment, the switching units are arranged in a second arrangement manner. Please refer to FIGS. 4D and 4E. The switching units are arranged in a second arrangement manner in this embodiment. The only difference between the second arrangement manner and the first arrangement manner shown in FIG. 4B is that in any switching device on the second direction L2, each switching unit in the first switching circuit combination is adjacent to the corresponding switching unit in the second switching circuit combination. As shown in FIG. 4D, the switching units S1-1, S2-1, S1-3 and S2-3 are arranged corresponding to the switching units S2-2, S1-2, S2-4 and S1-4 along the second direction L2. FIG. 4E is a schematic phase diagram of the control signals corresponding to the switching units in FIG. 4D. It can be seen that on the second direction L2, the adjacent switching units are controlled by the control signals out of phase with each other. With this arrangement, the input current ripple can be further reduced.

Figure 5A:
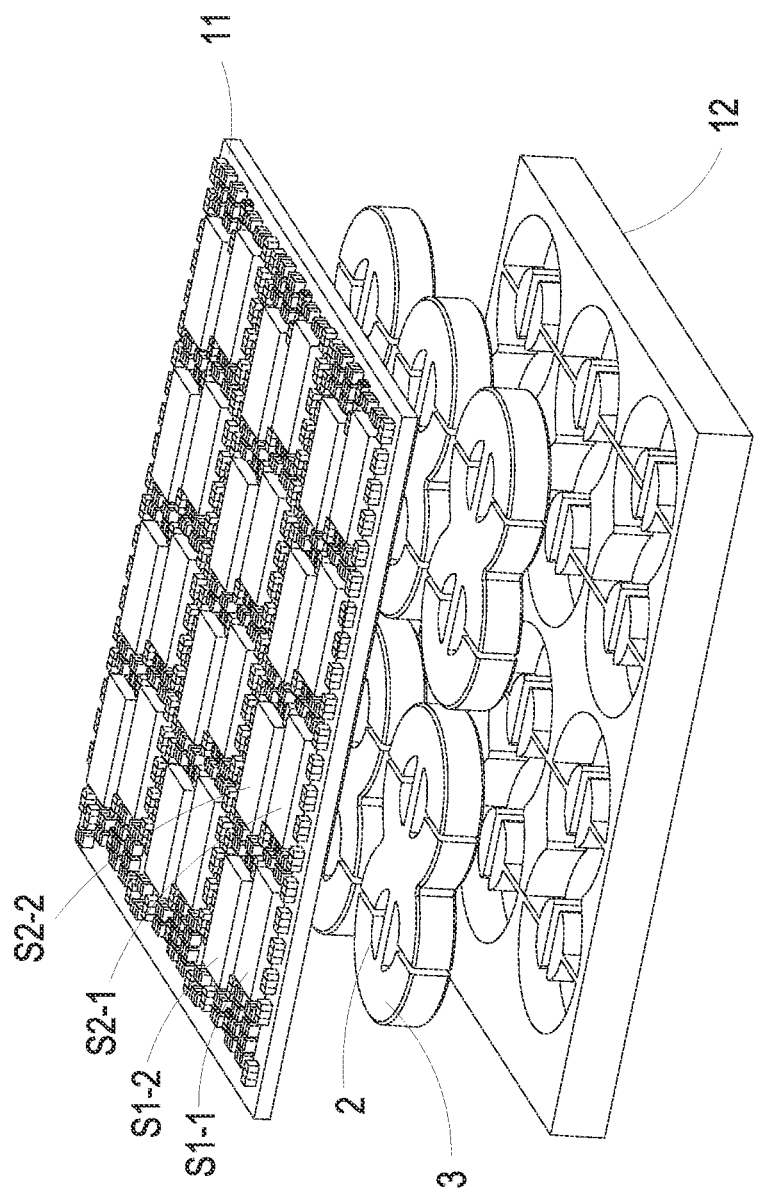
FIG. 5A is an exploded view illustrating the power converter module of FIG. 4A.

Please refer to FIGS. 4A and 5A, FIG. 5A is an exploded view illustrating the power converter module of FIG. 4A. The power converter module further includes a plurality of magnetic core assembly 2, the magnetic core assembly 2 is disposed in an inside layer of the multilayer printed circuit board 10. Any two switching circuits of the first switching circuit combination and any two switching circuits of the second switching circuit combination share a magnetic core assembly 2. For example, the switching units S1-1 and S1-2 of the switching circuits 1-1 and 1-2 of the first switching circuit combination share the same magnetic core assembly 2 with the switching units S2-1 and 2-2 of the switching circuits 2-1 and 2-2 of the second switching circuit combination. Every two switching circuit combinations in the embodiment have a magnetic core assembly 2 correspondingly. Moreover, in order to reduce the number of magnetic core assembly 2 and the assembly complexity, the magnetic integration technology is adopted to integrate a plurality of magnetic core assemblies 2. Thereby, the efficiency of the power converter module is improved and the number of magnetic core assembly 2 is reduced.

Figure 5B:
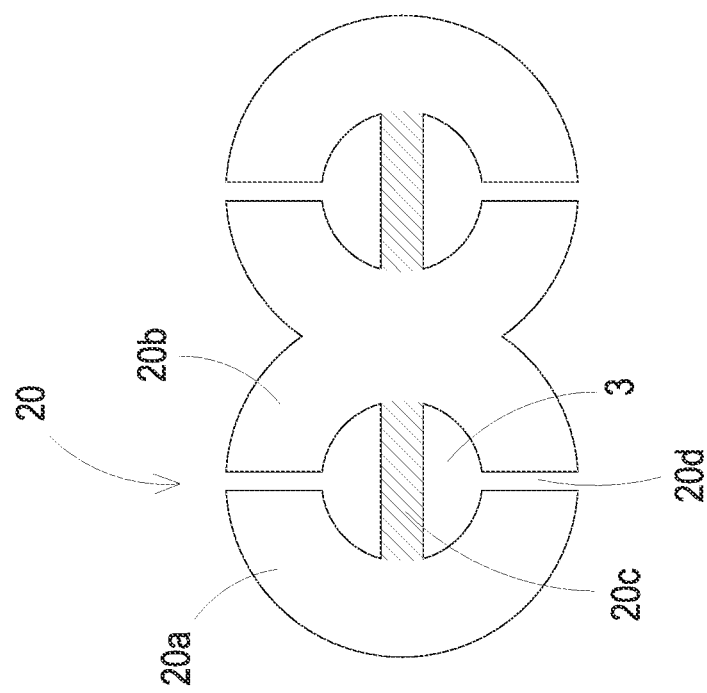
FIG. 5B is a schematic diagram of the magnetic core assembly 2 of FIG. 5A.

Please refer to FIG. 5B, FIG. 5B is a schematic diagram of the magnetic core assembly 2 of FIG. 5A. The magnetic core assembly 2 includes two magnetic rings 20 connected with each other. The magnetic ring 20 includes a first part 20a, a second part 20b and a magnetic region 20c connected to the first part 20a and the second part 20b. There is an air gap 20d between first part 20a and the second part 20b, and the air gap 20d is connected to the hole 3 in the middle of the magnetic ring 20.

Please refer to FIGS. 5A and 5B. The power converter module further includes at least one via with copper-plated sidewalls (not shown). One end of the via is electrically connected to the corresponding switching circuit, and the other end of the via is electrically connected to the second surface 12 of the multilayer printed circuit board 10. The via penetrates through the hole 3 of the magnetic core assembly 2 as a winding and forms an inductor of the corresponding switching circuit with the magnetic core assembly 2.

In each magnetic ring 20, the via is provided as the winding, which penetrates the hole 3 of the magnetic core assembly 2 to form two inductors. The two inductors respectively correspond to two adjacent switching circuits in the same switching circuit combination, such as the switching circuits 1-1 and 1-2 shown in FIG. 5A. Furthermore, the AC magnetic fluxes generated by the two inductors are at least partially cancelled by each other, and the DC magnetic fluxes generated by two inductors are at least partially cancelled by each other. Similarly, the switching circuits 2-1 and 2-2 respectively correspond to two inductors, and the AC magnetic fluxes generated by the two inductors are at least partially canceled by each other, and the DC magnetic fluxes generated by the two inductors are at least partially canceled by each other.

From the above descriptions, the present disclosure provides a power converter module. The power converter module includes a plurality of switching circuit combinations and a plurality of capacitors. The plurality of switching circuit combinations are controlled by the corresponding control signals, and each switching circuit combination includes a plurality of switching circuits. The switching circuits from different switching circuit combinations are alternately arranged, and the capacitors are disposed between the corresponding switching circuits. Therefore, when the switching circuit combination is activated by the corresponding control signal, the switching circuits of the switching circuit combination extract charges from different capacitors. In addition, the control signals corresponding to different switching circuit combinations are partially out of phase with each other, so the AC currents flowing through the same capacitor can be partially cancelled by each other. As a result, the power converter module of the present disclosure can achieve the same power conversion efficiency with a smaller number of capacitors. Further, the current ripple, the AC loss, and the size of the power converter module are reduced, thereby improving the power conversion efficiency of the power converter module.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power converter module, comprising:
   a multilayer printed circuit board, wherein the multilayer printed circuit board has a first surface and a second surface, the first surface and the second surface are opposite;
   a switching device comprising two switching circuit combinations, wherein the switching device is disposed on the first surface of the multilayer printed circuit board, each of the two switching circuit combinations comprises at least two switching circuits connected in parallel, each of the at least two switching circuits comprises a switching unit, and the two switching circuit combinations comprise a first switching circuit combination and a second switching circuit combination;
   a controlling device configured for outputting a first control signal and a second control signal to control the switching circuits of the first switching circuit combination and the switching circuits of the second switching circuit combination respectively, wherein the first control signal and the second control signal are out of phase with each other; and
   a capacitor device electrically connected in parallel with an input terminal of the power converter module, wherein the capacitor device comprises a plurality of capacitors and is disposed on the first surface of the multilayer printed circuit board;
   wherein on a direction, one of the switching unites of the second switching circuit combination is disposed between two of the switching units of the first switching circuit combination, and one of the switching units of the first switching circuit combination is disposed between two of the switching units of the second switching circuit combination, each of the plurality of capacitors of the capacitor device is neighboring to two adjacent switching units.

2. The power converter module according to claim 1, wherein the direction is a straight line direction.

3. The power converter module according to claim 2, wherein the power converter module comprises a plurality of switching devices, wherein in each of the switching devices, the switching units of the first switching circuit combination and the switching units of the second switching circuit combination are alternately arranged along a first direction, the switching units of the switching devices are stacked along a second direction, wherein the first direction is perpendicular to the second direction.

4. The power converter module according to claim 1, wherein the direction is a circular direction.

5. The power converter module according to claim 1, wherein the first switching circuit combination comprises two switching units, the second switching circuit combination comprises two switching units, one of the switching units of the first switching circuit combination, and one of the switching units of the second switching circuit combination, the other one of the switching units of the first switching circuit combination and the other one of the switching units of the second switching circuit combination are arranged in order along the direction.

6. The power converter module according to claim 5, wherein the capacitor device comprises a first capacitor, a second capacitor and a third capacitor, the first capacitor is neighboring to one of the switching units of the first switching circuit combination and one of the switching units of the second switching circuit combination, the second capacitor is neighboring to the other one of the switching units of the first switching circuit combination and the other one of the switching units of the second switching circuit combination, the third capacitor is neighboring to one of the switching units of the second switching circuit combination and the other one of the switching units of the first switching circuit combination, and the first switching circuit combination and the second switching circuit combination do not simultaneously extract charges from the first capacitor or the second capacitor.

7. The power converter module according to claim 1, wherein the first switching circuit combination comprises three switching units, the second switching circuit combination comprises three switching units, the switching units of the first switching circuit combination and the switching units of the second switching circuit combination are alternately arranged along the direction, the capacitor device comprises five capacitors, each of the five capacitors is neighboring to the two adjacent switching units.

8. The power converter module according to claim 1, wherein the first switching circuit combination comprises four switching units, the second switching circuit combination comprises four switching units, two of the switching units of the first switching circuit combination and two of the switching units of the second switching circuit combination are alternately arranged along a first direction, the other two of the switching units of the first switching circuit combination and the other two of the switching units of the second switching circuit combination are alternately arranged along the first direction, and two of the switching units and the other two of the switching units in each switching circuit combination are arranged along a second direction, wherein the second direction is perpendicular to the first direction.

9. The power converter module according to claim 8, further comprising a plurality of the switching devices, wherein the switching units of the plurality of switching devices are stacked along the second direction.

10. The power converter module according to claim 1, further comprising at least one magnetic core assembly disposed on an inside layer of the multilayer printed circuit board.

11. The power converter module according to claim 10, wherein the magnetic core assembly comprises two magnetic rings connected with each other, each of the magnetic rings comprises a first part, a second part and a magnetic region connected to the first part and the second part, there is an air gap between the first part and the second part, and the air gap is connected to a hole in the middle of each of the magnetic rings.

12. The power converter module according to claim 11, further comprising at least one via, wherein an end of the via is electrically connected to one of the switching circuits, the other end of the via is electrically connected to the second surface of the multilayer printed circuit board, the via penetrates through the hole of the magnetic core assembly and forms an inductor of one of the switching circuits with the magnetic core assembly.

13. The power converter module according to claim 12, wherein each of the magnetic rings further comprises two holes, the at least one via penetrates through the two holes in each of the magnetic rings to form two inductors, the two inductors respectively correspond to two of the switching circuits of the first switching circuit combination or two of the switching circuits of the second switching circuit combination, the AC magnetic fluxes generated by the two inductors are at least partially cancelled by each other, and the DC magnetic fluxes generated by the two inductors are at least partially cancelled by each other.

14. The power converter module according to claim 1, wherein each of the switching units has a driving device correspondingly, and the driving device is controlled by the controlling device.

* * * * *